United States Patent
Jang et al.

(10) Patent No.: US 7,683,467 B2
(45) Date of Patent: Mar. 23, 2010

(54) INTEGRATED CIRCUIT PACKAGE SYSTEM EMPLOYING STRUCTURAL SUPPORT

(75) Inventors: Byoung Wook Jang, Seoul (KR); Young Cheol Kim, Yongin-si (KR); Koo Hong Lee, Seoul (KR)

(73) Assignee: Stats Chippac Ltd., Singapore (SG)

( * ) Notice: Subject to any disclaimer, the term of this patent is extended or adjusted under 35 U.S.C. 154(b) by 554 days.

(21) Appl. No.: 11/635,941

(22) Filed: Dec. 7, 2006

(65) Prior Publication Data

US 2008/0135989 A1    Jun. 12, 2008

(51) Int. Cl.
    *H01L 23/02*    (2006.01)
(52) U.S. Cl. .................. 257/686; 257/685; 257/777; 257/E25.005; 257/E25.006; 257/E25.021; 257/E25.026; 257/E25.027; 257/E23.085
(58) Field of Classification Search .......... 257/685, 257/686, 723, 777, E25.005, E25.006, E25.021, 257/E25.026, E25.027, E23.085; 438/109, 438/122, FOR. 368, FOR. 413, FOR. 426
See application file for complete search history.

(56) References Cited

U.S. PATENT DOCUMENTS

| | | | |
|---|---|---|---|
| 5,757,080 A | 5/1998 | Sota | |
| 6,239,367 B1 | 5/2001 | Hsuan et al. | |
| 6,476,474 B1 | 11/2002 | Hung | |
| 6,677,674 B2 | 1/2004 | Nagao | |
| 7,145,247 B2 | 12/2006 | Kawano et al. | |
| 7,193,309 B2 | 3/2007 | Huang et al. | |
| 2001/0015485 A1 | 8/2001 | Song et al. | |
| 2006/0151865 A1* | 7/2006 | Han et al. | 257/686 |
| 2007/0117266 A1* | 5/2007 | Ball | 438/108 |
| 2008/0029905 A1 | 2/2008 | Merilo et al. | |

FOREIGN PATENT DOCUMENTS

JP    4340751    11/1992

* cited by examiner

*Primary Examiner*—Jasmine J Clark
(74) *Attorney, Agent, or Firm*—Mikio Ishimaru

(57) ABSTRACT

An integrated circuit package system that includes: providing an electrical interconnect system including a support structure and a lead-finger system; stacking a first device over the support structure; stacking a second device over the first device; connecting the first device and the second device to the lead-finger system; stacking a dummy device over the second device; and exposing a support structure bottom side and a dummy device top side for thermal dissipation.

20 Claims, 2 Drawing Sheets

INTEGRATED CIRCUIT PACKAGE SYSTEM EMPLOYING STRUCTURAL SUPPORT

CROSS-REFERENCE TO RELATED APPLICATION(S)

The present application contains subject matter related to co-pending U.S. patent application Ser. No 11/462,568, assigned to STATS ChipPAC Ltd.

The present application also contains subject matter related to a co-pending U.S. patent application Ser. No. 11/462,588, assigned to STATS ChipPAC Ltd.

The present application also contains subject matter related to a co-pending U.S. patent application Ser. No. 11/462,607, assigned to STATS ChipPAC Ltd.

The present application also contains subject matter related to a co-pending U.S. patent application Ser. No. 11/536,502, assigned to STATS ChipPAC Ltd.

The present application contains subject matter related to co-pending U.S. patent application Ser. No. 11/608,123 The related application is assigned to STATS ChipPAC Ltd.

TECHNICAL FIELD

The present invention relates generally to integrated circuits, and more particularly to an integrated circuit package system employing structural support.

BACKGROUND ART

Integrated circuits are what power many of today's consumer electronics. Integrated circuits can be found in cellphones, video cameras, portable music players, computers, and even automobiles. As customer demand improves integrated circuit (IC) performance, faster, more reliable, and higher-density circuits, need to be produced. Various techniques, such as, ball grid array (BGA), flip-chip, and multi-chip modules (MCM), have been developed to meet the continued demands for improving system performance and hardware capabilities, while the space in which to provide these improved hardware capabilities continues to decrease.

MCM may include two or more chips stacked one on top of another (i.e.—vertically stacked). This mounting technique permits a higher density of chips or integrated circuits on the MCM substrate. The MCM substrate may include one or more layers of electrically conductive material separated by dielectric materials.

Although vertically stacked MCM's may increase the effective density of chips, over that of horizontally placed MCM components, it has the disadvantage in that the MCM's must usually be assembled before the component chips and chip connections can be tested. These extra manufacturing steps can lead to increased cost and decreased product yield if the chips are defective.

Another common problem associated with vertically stacked MCM's is that the bottom chip must be larger than the top chip to accommodate the plurality of bond pads located on the bottom chip. Due to the constraint of limited space available for mounting individual chips on a substrate, the larger configuration of the bottom chip decreases the number of chips per semiconductor wafer, and correspondingly, increases the cost of manufacturing. Additionally, since the top chip must be made smaller than the bottom chip, the top chip possesses less space for electronic components and circuits, which is counter to the goal of developing higher density integrated circuits.

Another problem of vertically stacked MCM's is the lack of sufficient thermal dissipation. Insufficient thermal dissipation can lead to package over heating and chip bonding problems. Chip bonding problems arise when high temperatures trigger thermal expansion differences between disparate materials within a package. These differences in thermal expansion rates can lead to warpage, delamination and chip cracking problems.

Thus, a need still remains for a reliable integrated circuit package system and method of fabrication, wherein the integrated circuit package system possesses a high-density of integrated circuits while preventing warpage and delamination problems. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing an electrical interconnect system including a support structure and a lead-finger system; stacking a first device over the support structure; stacking a second device over the first device; connecting the first device and the second device to the lead-finger system; stacking a dummy device over the second device; and exposing a support structure bottom side and a dummy device top side for thermal dissipation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
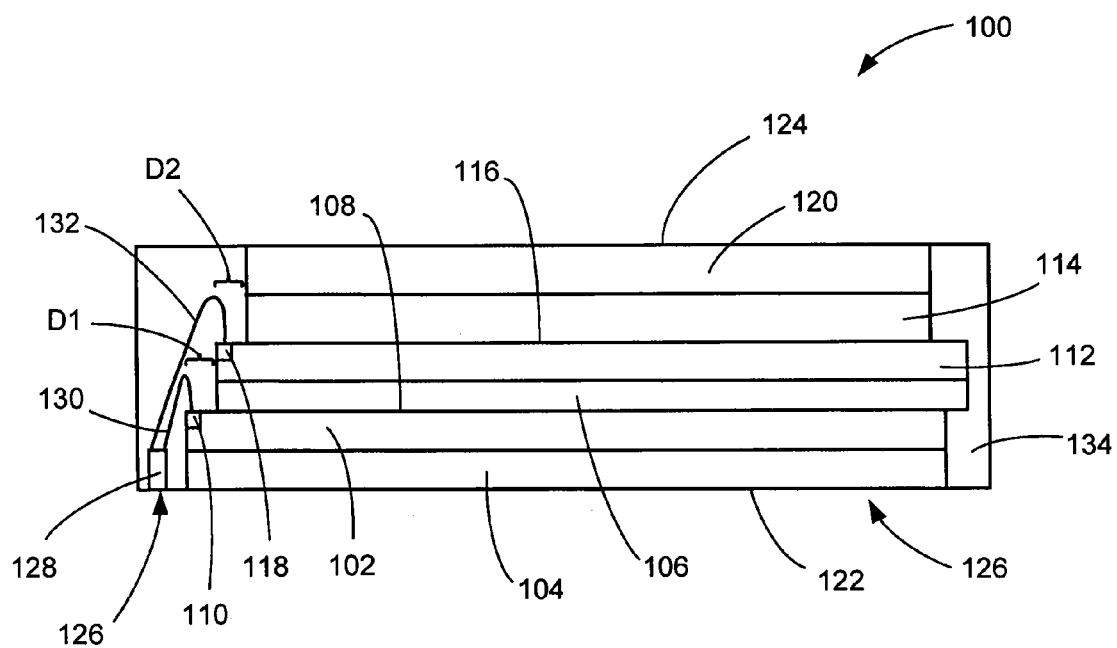
FIG. 1 is a cross sectional view of an integrated circuit package system, in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the support structure, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a cross sectional view of an integrated circuit package system 100, in accordance with an embodiment of the present invention. As an exemplary illustration, the integrated circuit package system 100 may include an internal stacking module.

Per this embodiment, the integrated circuit package system 100 includes a first device 102 stacked over and secured to a support structure 104. By way of example, the first device 102 may include semiconductor chips and integrated circuit packages selected from active components, passive components, stacked components, memory components, and so forth, in numerous configurations and arrangements as may be needed. It is to be understood that the first device 102 covers a wide range of semiconductor chip and integrated circuit package configurations involving various sizes, dimensions, and electrical contact techniques, and the type of chip or package configuration employed should only be limited by the design specifications of the integrated circuit package. Furthermore, by way of example, the support structure 104 may include a paddle, a film adhesive, or a thermally conductive layer. However, it is to be understood that the support structure 104 may include any structure suitable for supporting and/or dissipating heat away from the first device 102.

A first inter-device structure 106 is stacked over and secured to the first device 102. More specifically, the first inter-device structure 106 is stacked over and secured to a first device active side 108 of the first device 102 in an offset fashion, thereby exposing a first device bonding pad 110. As illustrated, the first inter-device structure 106 is stacked over and positioned in such a manner that the first device bonding pad 110 is exposed and accessible for making an electrical connection. An offset distance "D1" is illustrated by the distance between the perimeter of the first device 102 and the perimeter of the first inter-device structure 106. The minimum required distance for the offset distance "D1" is only limited by the technology of the electrical bonding equipment employed for making an electrical connection to the first device bonding pad 110.

By way of example, the first inter-device structure 106 may include an adhesive with or without thermally conducting capabilities, a spacer, an electromagnetic interference shield for blocking potentially disruptive energy fields, or a combination thereof. For example, if the first inter-device structure 106 is an adhesive layer, the adhesive layer may include a film or a partially unconsolidated (e.g.—a liquid or a gel) adhesive material, which allows a second device 112 to self-align. Furthermore, if the first inter-device structure 106 is an adhesive layer, the adhesive layer can be deposited in any configuration or shape, which facilitates the adhesion of the second device 112. The position, shape and size of the first inter-device structure 106 is only limited by the exposure of the first device bonding pad 110.

The second device 112 is aligned, stacked over and secured to the first inter-device structure 106. The second device 112 may include semiconductor chips and integrated circuit packages selected from active components, passive components, stacked components, memory components, and so forth, in numerous configurations and arrangements as may be needed. It is to be understood that the second device 112 covers a wide range of semiconductor chip and integrated circuit package configurations involving various sizes, dimensions, and electrical contact techniques, and the type of chip or package configuration employed should only be limited by the design specifications of the integrated circuit package.

A second inter-device structure 114 is stacked over and secured to the second device 112. More specifically, the second inter-device structure 114 is stacked over and secured to a second device active side 116 of the second device 112 in a manner that exposes a second device bonding pad 118. An offset distance "D2" is illustrated by the distance between the perimeter of the second device 112 and the perimeter of the second inter-device structure 114. The minimum required distance for the offset distance "D2" is only limited by the technology of the electrical bonding equipment employed for making an electrical connection to the second device bonding pad 118.

The second inter-device structure 114 may include an adhesive with or without thermally conducting capabilities, a spacer, an electromagnetic interference shield for blocking potentially disruptive energy fields, or a combination thereof. For example, if the second inter-device structure 114 is an adhesive layer, the adhesive layer may include a film or a partially unconsolidated (e.g.—a liquid or a gel) adhesive material, which allows a dummy device 120 to self-align. Further, if the second inter-device structure 114 is an adhesive layer, the adhesive layer can be deposited in any configuration or shape, which facilitates the adhesion of the dummy device 120. The position, shape and size of the second inter-device structure 114 is only limited by the exposure of the second device bonding pad 118 and the formation of the dummy device 120.

The dummy device 120 is aligned, stacked over, and secured to the second inter-device structure 114. By way of example, the dummy device 120 may include an inactive semiconductor die/package, a spacer, a strip level net spacer, an electromagnetic interference shield, a thermally conductive layer, or a combination thereof. However, it is to be understood that the present invention is not to be limited to these examples. In accordance with the scope of the invention, the dummy device 120 may include any structure, material, and/or configuration that imparts support and rigidity to the integrated circuit package system 100.

Notably, the formation of the dummy device 120 and the second inter-device structure 114 over the second device 112 enhances the thermal dissipation ability of the integrated circuit package system 100 by exposing at least a portion of a support structure bottom side 122 and at least a portion of a dummy device top side 124 to an external environment. By configuring the integrated circuit package system 100 as a symmetrical heat dissipating structure (i.e.—heat is dissipated out of the top and bottom of the structure), stresses formed within the integrated circuit package system 100 due to high temperatures can be reduced.

It has been discovered by the present inventors that the symmetrical heat dissipating structure of the present invention helps to prevent warpage of the first device 102, the second device 112 and/or warpage of the integrated circuit package system 100, as a whole. Furthermore, by forming the dummy device 120 from materials that provide structural support and/or thermal dissipating capabilities, incidences of delamination, device cracking, and/or warpage are even further reduced.

Moreover, the improved thermal dissipation ability of the integrated circuit package system 100 can be further enhanced by attaching a thermally conductive substrate or a heat sink adjacent the support structure 104 and/or the dummy device 120. By improving the ability of the integrated circuit package system 100 to dissipate heat, the reliability and the useful life of the integrated circuit package system 100 can be improved.

For purposes of illustration, the first device 102, the support structure 104, the first inter-device structure 106, the second device 112, the second inter-device structure 114, and the dummy device 120 are secured to each other using adhesives well known in the art and not repeated herein. Notably, the present invention may employ "zero-fillet" technology when depositing the adhesive material.

An electrical interconnect system 126, which includes the support structure 104 and a lead-finger system 128, provides an electrical interface between external electrical circuits and the first device 102 and the second device 112. The first device 102 and the second device 112 are electrically connected to the electrical interconnect system 126 via a first wire bond 130 and a second wire bond 132, respectively. It will be appreciated by those skilled in the art that the first wire bond 130 and the second wire bond 132 can be deposited using materials and techniques well known within the art and are not repeated herein.

By way of example, the electrical interconnect system 126 may include a thin metal sheet, a conductive plated pattern on plastic tape, or any structure suitable for electrically interconnecting the first device 102 and the second device 112 to external electrical circuits. By way of example, the electrical interconnect system 126 may include a structure with single in-line leads formed to include: gull-wing leads, j-leads, leadless leads that wrap around the package edge to maintain a low profile, downset leads, pin leads, and/or ball leads. However, it is to be understood that the present invention is not to be limited to these examples. In accordance with the scope of the present invention, the electrical interconnect system 126 may include any electrical interconnection structure (i.e.—leads) that facilitates the incorporation of the integrated circuit package system 100 into a higher-level assembly, such as a printed circuit board or other suitable structure for supporting the integrated circuit package system 100.

Additionally, for even greater interconnect density, the present invention may employ single row, dual row and/or half-etched leads or lands. Furthermore, the lead-finger system 128 of the electrical interconnect system 126 may be made from any number of materials that provide an electrically conductive and bondable surface for the first wire bond 130 and the second wire bond 132. For example, the lead-finger system 128 may be made from a copper alloy or a nickel/palladium combination.

An encapsulation material 134, such as a plastic molding compound, is deposited over the integrated circuit package system 100. Notably, the encapsulation material 134 does not cover at least a portion of the support structure bottom side 122 and at least a portion of the dummy device top side 124. By leaving the support structure bottom side 122 and the dummy device top side 124 exposed to the external environment, the ability of the integrated circuit package system 100 to dissipate heat is greatly improved. Furthermore, the encapsulation material 134 not only protects the integrated circuit package system 100 from the external environment but it also provides support and stability. The encapsulation material 134 and molding techniques using it are well known in the art and not repeated herein.

Notably, the present invention includes forming the integrated circuit package system 100 within package configurations, such as package-in-package (PiP) and package-on-package configurations (PoP). The PiP system is a 3D package system that stacks a fully tested Internal Stacking Module (ISM) on top of a Base Assemble Package (BAP) to form a single Chip Scale Package (CSP). PoP is a 3D package in which fully tested packages are stacked on top of another single or stacked package during the board mount process. As exemplary illustrations, the first device 102, the second device 112, and/or the integrated circuit package system 100, itself, may include PiP or PoP configurations. By way of example, such a structure can be used to form high-density memory systems.

Another notable aspect of the present invention is that it allows for testing of the first device 102 and the second device 112 before adhering them to the electrical interconnect system 126, therefore ensuring the use of known good die or packages in the manufacturing process. Additionally, after adhering the first device 102 and the second device 112 to the electrical interconnect system 126, these assemblies can also be tested before incorporation into additional package systems. This ensures that the final product includes known good assemblies, and thereby improves the manufacturing process yield for packaging.

Furthermore, the profile of the integrated circuit package system 100 can be reduced by employing thin and ultra-thin devices for the first device 102 and the second device 112. Through the use of thin and ultra-thin devices, the integrated circuit package system 100 may achieve a package height of about 220 micrometers or less, even when employing the same die or two different die for the first device 102 and the second device 112. This reduced profile design of the integrated circuit package system 100 also naturally improves thermal dissipation because the heat flux of a solid object is inversely proportional to the thickness of the object, noting Fourier's law of heat conduction in solids.

Additionally, standard packages or die may be used for the first device 102 and the second device 112, thereby reducing the cost of manufacturing the integrated circuit package system 100.

Moreover, although the present invention only illustrates the second device 112 stacked over the first device 102, the scope of the present invention includes any number of devices (i.e.—active or passive) stacked over the first device 102 to achieve the desired purpose of the integrated circuit package system 100. As is evident from the disclosure herein, a third device and a fourth device may be stacked between the second device 112 and the dummy device 120 to achieve a higher-density integrated circuit system.

Figure 2:
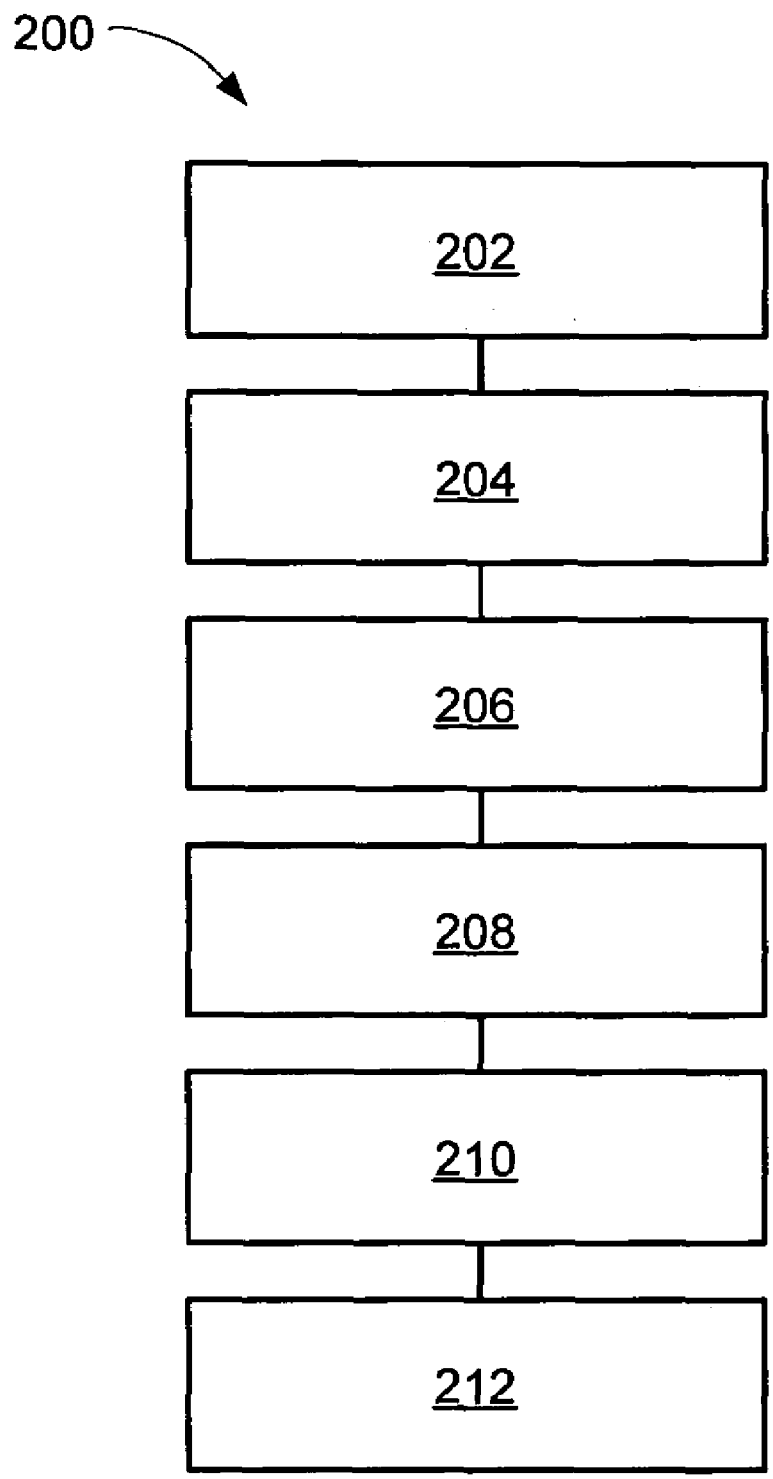
FIG. 2 is a flow chart of an integrated circuit package system for the integrated circuit package system, in accordance with an embodiment of the present invention.

Referring now to FIG. 2, therein is shown a flow chart of an integrated circuit package system 200 for the integrated circuit package system 100, in accordance with an embodiment of the present invention. The integrated circuit package system 200 includes providing an electrical interconnect system including a support structure and a lead-finger system in a block 202; stacking a first device over the support structure in a block 204; stacking a second device over the first device in a block 206; connecting the first device and the second device to the lead-finger system in a block 208; stacking a dummy device over the second device in a block 210; and exposing a support structure bottom side and a dummy device top side for thermal dissipation in a block 212.

It has been discovered that the present invention thus has numerous aspects. A principle aspect is that the present invention provides for a high-density integrated circuit package system by stacking the individual components in an offset fashion Another aspect of the present invention is that it provides structural rigidity to an integrated circuit package system by forming a dummy device over the second device. The dummy device provides support by eliminating package void space previously only filled by encapsulation material, thereby creating a unitary integrated circuit package system from top to bottom.

Another aspect of the present invention is that it provides two exposed surfaces for thermal dissipation. By facilitating the dissipation of thermal energy via the formation of a symmetrical heat dissipating structure, the incidences of warping, delamination and chip cracking are reduced.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for providing structural support, heat dissipation, and reduced warpage stresses. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
providing an electrical interconnect system including a support structure and a lead-finger system;
stacking a first device over the support structure;
stacking a second device over the first device to expose a first device bonding pad;
connecting the first device and the second device to the lead-finger system;
stacking a dummy device over the second device; and
exposing a support structure bottom side and a dummy device top side from an encapsulation material for thermal dissipation.

2. The system as claimed in claim 1 wherein:
stacking the dummy device over the second device includes stacking an inactive semiconductor die/package, a spacer, an electromagnetic interference shield, a thermally conductive layer, or a combination thereof.

3. The system as claimed in claim 1 wherein:
stacking the dummy device over the second device provides structural rigidity to the integrated circuit package system.

4. The system as claimed in claim 1 wherein:
stacking the second device includes offsetting the second device.

5. The system as claimed in claim 1 further comprising:
configuring the lead-finger system to include a single in-line lead.

6. An integrated circuit package system comprising:
providing an electrical interconnect system including a support structure and a lead-finger system;
stacking a first device over the support structure;
stacking a first inter-device structure over the first device;
stacking a second device over the first inter-device structure;
connecting the first device and the second device to the lead-finger system;
stacking a second inter-device structure over the second device;
stacking a dummy device over the second inter-device structure; and
depositing an encapsulation material that exposes a support structure bottom side and a dummy device top side.

7. The system as claimed in claim 6 wherein:
stacking the first inter-device structure includes offsetting the first inter-device structure to expose a first device bonding pad.

8. The system as claimed in claim 6 wherein:
stacking the first inter-device structure and the second inter-device structure includes stacking an adhesive with or without thermally conducting capabilities, a spacer, an electromagnetic interference shield for blocking potentially disruptive energy fields, or a combination thereof.

9. The system as claimed in claim 6 further comprising:
configuring the integrated circuit package system to prevent warpage.

10. The system as claimed in claim 6 further comprising:
configuring the integrated circuit package system to be part of a package-in-package system.

11. An integrated circuit package system comprising:
an electrical interconnect system including a support structure and a lead-finger system;
a first device over the support structure; a second device over the first device exposing a first device bonding pad; the first device and the second device electrically connected to the lead-finger system; a dummy device over the second device; and
a support structure bottom side and a dummy device top side exposed from an encapsulation material for thermal dissipation.

12. The system as claimed in claim 11 wherein:
the dummy device includes an inactive semiconductor die/package, a spacer, an electromagnetic interference shield, a thermally conductive layer, or a combination thereof.

13. The system as claimed in claim 11 wherein:
the dummy device provides structural rigidity to the integrated circuit package system.

14. The system as claimed in claim 11 wherein:
the second device is offset from the first device.

15. The system as claimed in claim 11 wherein:
the lead-finger system includes a single in-line lead.

16. The system as claimed in claim 11 further comprising:
a first inter-device structure between the first device and the second device; and
a second inter-device structure between the second device and the dummy device.

17. The system as claimed in claim 16 wherein:
the first inter-device structure is offset from the first device to expose a first device bonding pad.

18. The system as claimed in claim 16 wherein:
the first inter-device structure and the second inter-device structure include an adhesive with or without thermally conducting capabilities, a spacer, an electromagnetic interference shield for blocking potentially disruptive energy fields, or a combination thereof.

19. The system as claimed in claim 11 wherein:
the integrated circuit package system configuration prevents warpage.

20. The system as claimed in claim 11 wherein:
the integrated circuit package system is part of a package-in-package system.

* * * * *